(12) United States Patent
Wu et al.

(10) Patent No.: US 10,461,701 B2
(45) Date of Patent: Oct. 29, 2019

(54) SYSTEM AND METHOD FOR REDUCING OUTPUT HARMONICS

(71) Applicant: Silicon Laboratories Inc., Austin, TX (US)

(72) Inventors: Sherry X. Wu, Austin, TX (US); Sriharsha Vasadi, Austin, TX (US); Mustafa H. Koroglu, Austin, TX (US); Rangakrishnan Srinivasan, Austin, TX (US)

(73) Assignee: SILICON LABORATORIES INC., Austin, TX (US)

( * ) Notice: Subject to any disclaimer, the term of this patent is extended or adjusted under 35 U.S.C. 154(b) by 2 days.

(21) Appl. No.: 15/875,274

(22) Filed: Jan. 19, 2018

(65) Prior Publication Data

US 2019/0229684 A1    Jul. 25, 2019

(51) Int. Cl.
*H03F 3/04*    (2006.01)
*H03F 1/32*    (2006.01)
(Continued)

(52) U.S. Cl.
CPC ............ *H03F 1/3217* (2013.01); *H03F 1/086* (2013.01); *H03F 1/3205* (2013.01); *H03F 3/195* (2013.01); *H03F 3/211* (2013.01); *H03F 3/3013* (2013.01); *H03F 3/45179* (2013.01); *H03F 3/19* (2013.01); *H03F 2200/171* (2013.01); *H03F 2200/21* (2013.01); *H03F 2200/297* (2013.01); *H03F 2200/387* (2013.01); *H03F 2200/451* (2013.01);
(Continued)

(58) Field of Classification Search
CPC ........ H03F 1/3217; H03F 3/211; H03F 1/086; H03F 3/195; H03F 1/3205; H03F 3/45179; H03F 3/3013; H03F 2200/297; H03F 2203/45031; H03F 2203/45022; H03F 2200/387; H03F 2200/451; H03F 2203/21157; H03F 2200/21; H03F 2203/45034; H03F 2200/17
USPC ........ 330/262–264, 278, 279, 302, 306, 310
See application file for complete search history.

(56) References Cited

U.S. PATENT DOCUMENTS 6,670,838 B1    12/2003 Cao
7,782,138 B2 *   8/2010 Dally .................. H03G 3/3036
                                                 330/278
(Continued)

OTHER PUBLICATIONS

Action on the Merits by U.S.P.T.O.; regarding U.S. Appl. No. 15/875,278, filed Jan. 19, 2018.
(Continued)

*Primary Examiner* — Khanh V Nguyen
(74) *Attorney, Agent, or Firm* — Polansky & Associates, P.L.L.C.; Paul J. Polansky

(57) ABSTRACT

In one form, a signal generator system such as a power amplifier system includes an amplification stage, a lowpass filter, and a controller. The amplification stage includes a first amplifier having an input for receiving an input signal, a control input for receiving a first control signal, and an output. The lowpass filter has a first input coupled to the output of the first amplifier, and an output. The controller has a first input coupled to the output of the lowpass filter, and a first output coupled to the control input of the first amplifier, wherein the controller varies the first control signal to reduce a difference between the output of the lowpass filter and a first target voltage level.

28 Claims, 10 Drawing Sheets

(51) Int. Cl.
*H03F 3/30* (2006.01)
*H03F 3/45* (2006.01)
*H03F 3/195* (2006.01)
*H03F 1/08* (2006.01)
*H03F 3/21* (2006.01)
*H03F 3/19* (2006.01)

(52) U.S. Cl.
CPC ............... *H03F 2203/21157* (2013.01); *H03F 2203/45022* (2013.01); *H03F 2203/45031* (2013.01); *H03F 2203/45034* (2013.01)

(56) References Cited

U.S. PATENT DOCUMENTS

| | | |
|---|---|---|
| 9,641,141 B1 | 5/2017 | Zheng et al. |
| 2015/0162878 A1* | 6/2015 | Ba ........................ H03F 1/0233 330/251 |
| 2018/0115291 A1* | 4/2018 | Mizokami .............. G01R 25/04 |

OTHER PUBLICATIONS

Silicon Laboratories Inc.; "Adding Smart Wireless Connectivity to an LED Lightbulb"; whitepaper; Aug. 15, 2017, 6 pages.
Silicon Laboratories Inc.; "Helping Sengled Develop a Better Lightbulb"; whitepaper; Feb. 23, 2017, 2 pages.

* cited by examiner

SYSTEM AND METHOD FOR REDUCING OUTPUT HARMONICS

CROSS REFERENCE TO RELATED APPLICATIONS

The present application is related to a application entitled "Synthesizer-Power Amplifier Interface in a Wireless Circuit," application Ser. No. 15/875,278, invented by Rangakrishnan Srinivasan, Sriharsha Vasadi, Zhongda Wang, Mustafa H. Koroglu, John Khoury, Aslamali A. Rafi, Michael S. Johnson, Francesco Barale, and Sherry Xiaohong Wu, filed of even date herewith and assigned to the assignee hereof, now U.S. Pat. No. 10,256,854, issued Apr. 9, 2019.

FIELD OF THE DISCLOSURE

The present disclosure relates generally to signal processing systems, and more particularly to signal processing systems such as power amplifiers that create unwanted harmonics.

BACKGROUND

Radio frequency (RF) power amplifiers are used in a variety of industrial and consumer products such as two-way radios and mobile phones. RF power amplifiers amplify a transmit signal up to a certain power level specified by regulatory authorities such as the United States Federal Communications Commission (FCC) and corresponding regulatory authorities in other countries. These regulatory authorities also specify emission limits for out-of-band signals created by, for example, unwanted harmonics generated in the RF power amplifier.

In products with transmit power limits on the order of a few Watts, the power amplifiers are typically combined with other components in a low-cost integrated circuit. However complementary metal-oxide-semiconductor (CMOS) integrated circuit technology is susceptible to manufacturing variations that create mismatches and therefore unwanted even order harmonics. To reduce the energy in these unwanted harmonics, external harmonic filtering networks can be used. However if the integrated circuit generates harmonics with significant energy, then these networks require large order filters, resulting in higher parts counts and higher product costs as well as lower output power and degraded efficiency due to higher insertion loss. Moreover the harmonics generated at the input of the external harmonic filtering network can self-interfere with other circuits in the chip and create other problems.

BRIEF DESCRIPTION OF THE DRAWINGS

The present disclosure may be better understood, and its numerous features and advantages made apparent to those skilled in the art by referencing the accompanying drawings, in which.

The use of the same reference symbols in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well. In the following description, numbers in hexadecimal format are indicated with "0x" prefix before the number.

DETAILED DESCRIPTION

Figure 1:
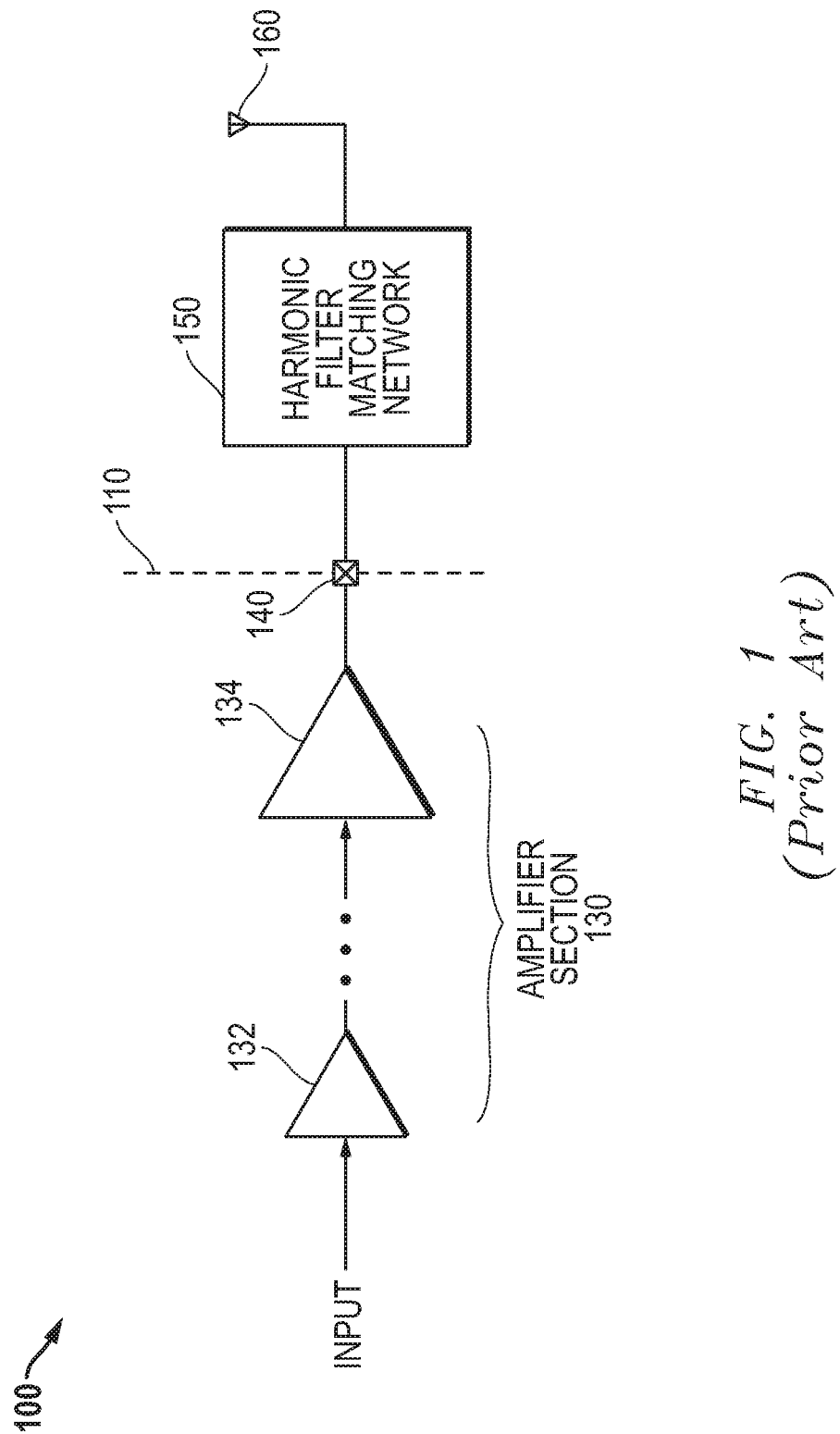
FIG. 1 illustrates in block diagram form a radio frequency (RF) transmission system known in the prior art.

FIG. 1 illustrates in block diagram form a radio frequency (RF) transmission system 100 known in the prior art. RF transmission system 100 includes generally an integrated circuit 110, a harmonic filter matching network 150, and an antenna 160. Integrated circuit 110 includes an amplifier section 130 and an integrated circuit terminal 140. Amplifier section 130 includes a set of power amplifiers connected serially including representative amplifiers 132 and 134. Amplifier 132 is a first amplifier of amplifier section 130 and has an input for receiving an input signal labeled "INPUT", and an output connected to a succeeding amplifier. Amplifier 134 is a last amplifier of amplifier section 130 and has an input connected to a preceding amplifier, and an output connected to integrated circuit terminal 140. Amplifier 134 is drawn larger than amplifier 132 to indicate that its output power level is larger than that of amplifier 132. Harmonic filter matching network 150 has an input connected to integrated circuit terminal 140, and an output connected to antenna 160.

To meet regulatory requirements for emissions, RF transmission system 100 includes harmonic filter matching network 150 external to integrated circuit 110. Harmonic filter matching network 150 includes discrete components such as inductors and capacitors and can be quite complex if amplifier section 130 generates harmonics with high energy. Thus if it were possible to reduce the order of harmonic filter matching network 150 or to eliminate it entirely, product cost could be reduced.

Figure 2:
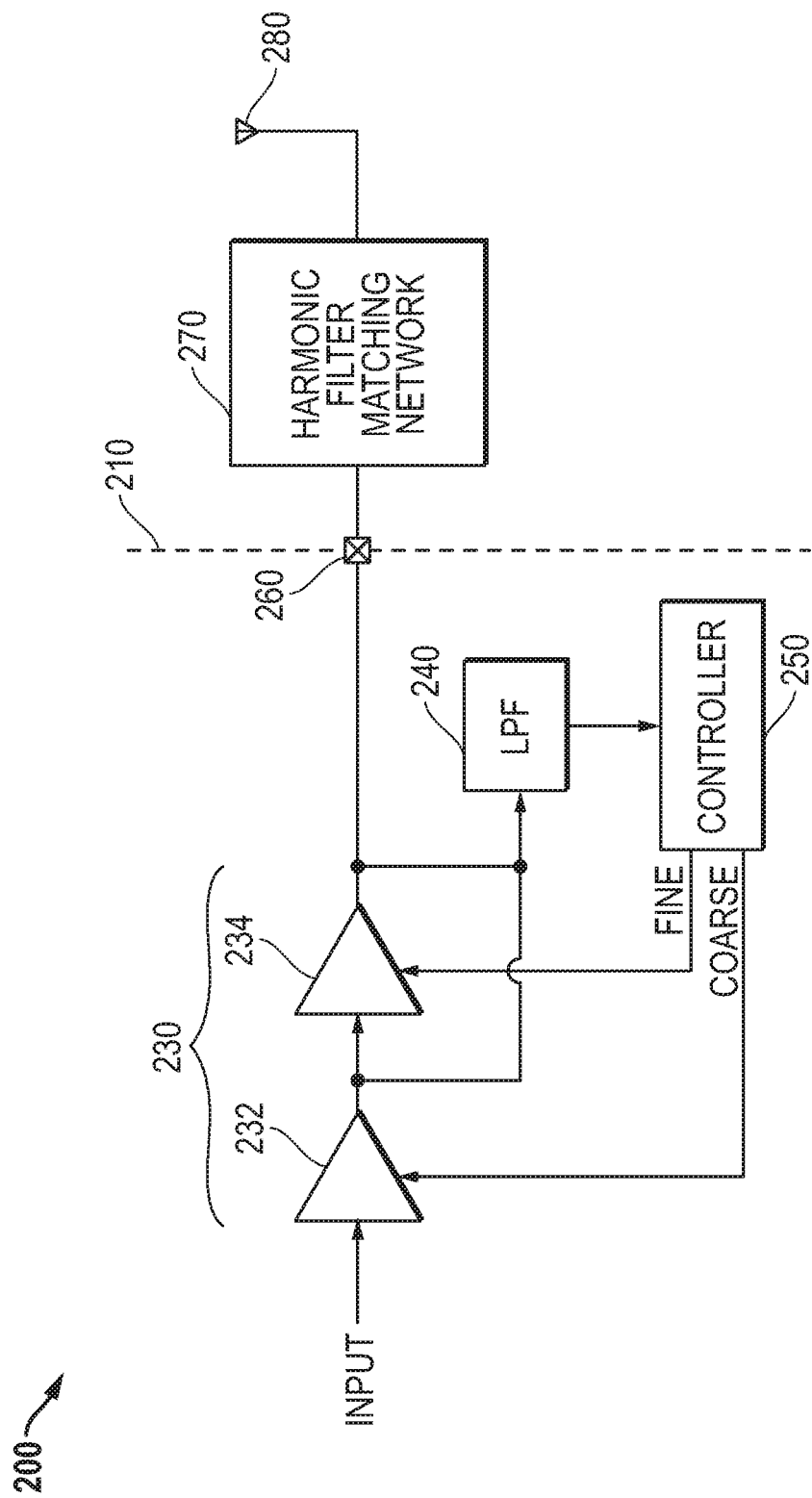
FIG. 2 illustrates in block diagram form a power amplifier system such as for RF transmission according to various embodiments disclosed herein.

FIG. 2 illustrates in block diagram form a power amplifier system 200 such as for RF transmission according to various embodiments disclosed herein. Power amplifier system 200 is a signal generation system including generally an integrated circuit 210, a harmonic filter matching network 270, and an antenna 280. Integrated circuit 210 includes an amplification stage 230, a lowpass filter 240, a controller 250, and an integrated circuit terminal 260. Amplification stage 230 includes a set of amplifiers connected serially. In the example shown in FIG. 2, amplification stage 230 includes two amplifiers 232 and 234 in which amplifier 232 is a predriver and has an input for receiving the INPUT signal, a gain input, and an output, and amplifier 234 is an output driver and has an input connected to the output of amplifier 232, a gain input, and an output connected to integrated circuit terminal 260. Lowpass filter 240 has inputs connected to the outputs of amplifiers 232 and 234, and an output. Controller 250 has an input connected to the output of lowpass filter 240, a first output connected to the gain input of amplifier 232 for providing a signal labeled "COARSE", and a second output connected to the gain input of amplifier 234 for providing a signal labeled "FINE". Harmonic filter matching network 270 has an input connected to integrated circuit terminal 260, and an output connected to antenna 280.

In operation, power amplifier system 200 adjusts the characteristics of amplifiers 232 and 242 during calibration to reduce the energy of the second harmonic of the output signal provided to integrated circuit terminal 260. The level of the second harmonic is highly dependent on its waveform. For example an ideal square wave, i.e. a square wave with a precise 50% duty cycle, has no energy at its second or any other even harmonics. However as the duty cycle deviates from 50%, the energy at its second and higher even harmonic frequencies grows.

Power amplifier system 200 measures the average or DC level of the waveform at the output of each amplifier using lowpass filter 240. The average level corresponds to duty cycle. Controller 250 controls the drive characteristics of each amplifier in a feedback loop and changes the drive characteristics until the duty cycle of a single signal or the average duty cycle of non-overlap-clocks is sufficiently close to 50%. In particular, controller 250 controls the relative strength of the pullup and pulldown transistors in amplifier 232 and the DC bias point of transistors in the final stage of amplifier 234 to achieve close to 50% duty cycle.

During calibration, controller 250 provides the INPUT signal as a 50% duty cycle signal to approximate an ideal square wave. The signal may be, for example, the unmodulated output of a frequency synthesizer or the output of a digital local oscillator. It then performs the calibration in two steps. First, controller 250 performs coarse calibration by connecting the input of lowpass filter 240 to the output of amplifier 232, and changes the COARSE signal to reduce the difference between the output of lowpass filter 240 and a first target voltage level. The first target voltage level may be, for example, a voltage midway between the power supply voltage rails. Controller 250 changes the COARSE signal until this difference is less than a first threshold. Then it performs fine calibration by connecting the input of lowpass filter 240 to the output of amplifier 234, and changes the FINE signal to reduce the difference between the output of lowpass filter 240 and a second target voltage level, which again may be a voltage midway between the power supply voltage rails but may be different from the first target voltage level. Controller 250 changes the FINE signal until this difference is less than a second threshold.

The COARSE and FINE signals can assume a variety of forms based on the circuit designs of the predriver and output driver. These forms will be described with respect to several specific embodiments presented below.

Figure 3:
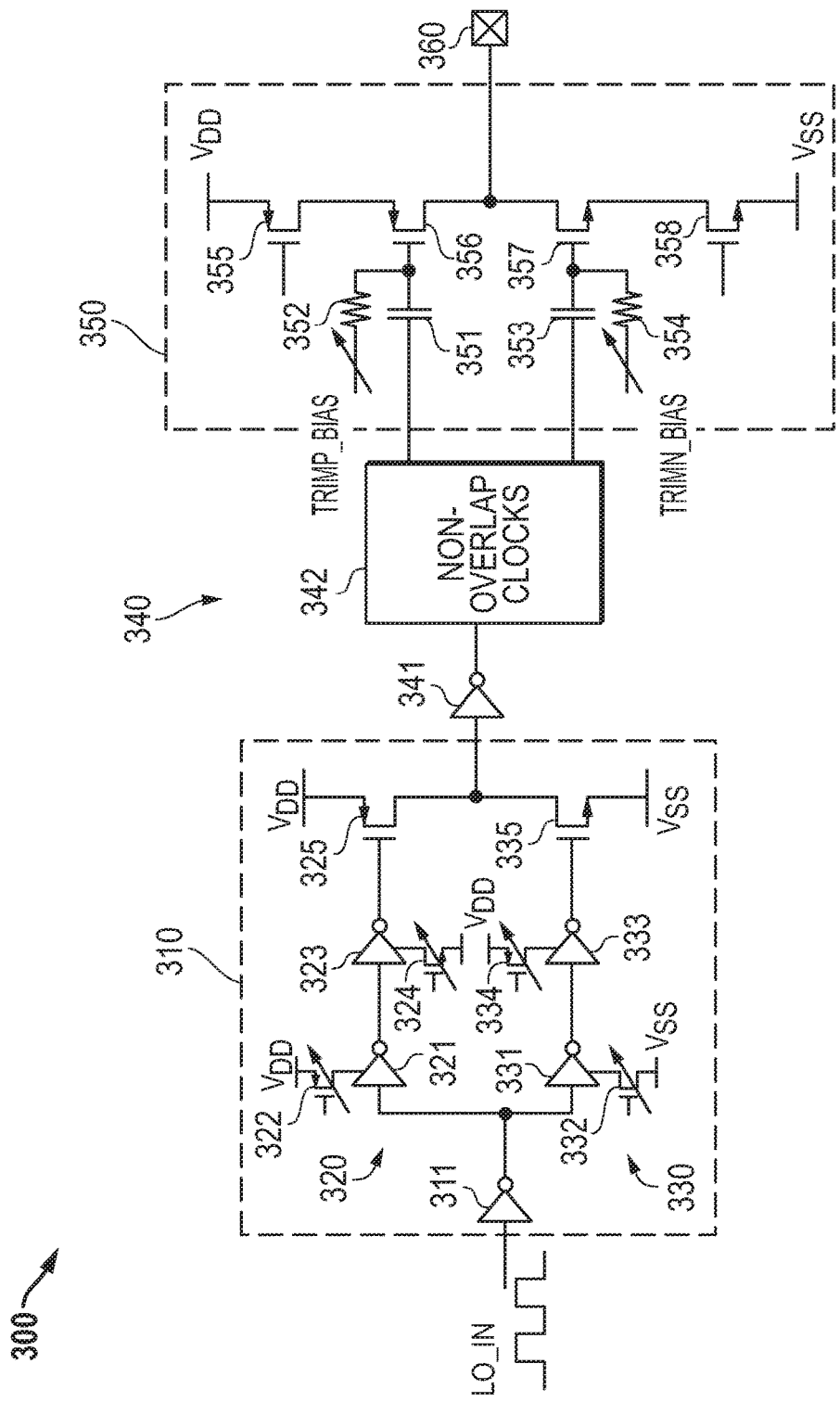
FIG. 3 illustrates in partial block diagram and partial schematic form an amplifier section of the power amplifier system of FIG. 2 according to a first embodiment.

FIG. 3 illustrates in partial block diagram and partial schematic form an amplifier section 300 of power amplifier system 200 of FIG. 2 according to a first embodiment. Amplifier section 300 includes a first amplifier 310 (corresponding to amplifier 232 in FIG. 2), an interface circuit 340, and a second amplifier 350 (corresponding to amplifier 234 in FIG. 2).

First amplifier 310 includes an inverter 311, a pullup path 320, and a pulldown path 330. Inverter 311 has an input for receiving a local oscillator signal labeled "LO_IN", and an output. Pullup path 320 includes an inverter 321, a transistor 322, an inverter 323, a transistor 324, and a transistor 325. Inverter 321 has an input connected to the output of inverter 311, an output, and a positive power supply terminal. Transistor 322 is a P-channel transistor having a variable drive strength and having source connected to a power supply voltage terminal labeled "$V_{DD}$", a gate for receiving a P-channel bias signal, a control terminal, and a drain connected to the positive power supply terminal of inverter 321. $V_{DD}$ is a more-positive power supply voltage terminal whose nominal value varies with the manufacturing process technology but which can have a value of, for example, 2.0 volts. Inverter 323 has an input connected to the output of inverter 321, an output, and a negative power supply terminal. Transistor 324 is an N-channel transistor having a variable drive strength and having a drain connected to the negative power supply terminal of inverter 321, a gate for receiving an N-channel bias signal, a control terminal, and a source connected to a power supply voltage terminal labeled "$V_{SS}$". $V_{SS}$ is a more-negative power supply voltage terminal typically forming a ground reference voltage at 0.0 volts. Transistor 325 is a P-channel transistor having a source connected to $V_{DD}$, a gate connected to the output of inverter 323, and a drain. Pulldown path 330 includes an inverter 331, a transistor 332, an inverter 333, a transistor 334, and a transistor 335. Inverter 331 has an input connected to the output of inverter 311, an output, and a negative power supply terminal. Transistor 332 is an N-channel transistor having a variable drive strength and having a drain connected to the negative power supply terminal of inverter 331, a gate for receiving the N-channel bias signal, a control terminal, and a source connected $V_{SS}$. Inverter 333 has an input connected to the output of inverter 331, an output, and a positive power supply terminal. Transistor 334 is a P-channel transistor having a variable drive strength and having a source connected to $V_{DD}$, a gate a gate for receiving the P-channel bias signal, a control terminal, and a drain connected to the positive power supply terminal of inverter 333. Transistor 335 is an N-channel transistor having a drain connected to the drain of transistor 325, a gate connected to the output of inverter 333, and a source connected to $V_{SS}$.

Interface circuit 340 includes an inverter 341, and a non-overlap clock generator 342. Inverter 341 has an input connected to the drains of transistors 325 and 335, and an output. Non-overlap clock generator 342 has an input connected to the output of inverter 341, a first output for providing a pullup signal labeled "RFP_IN", and a second output for providing a pulldown signal labeled "RFN_IN".

Second amplifier 350 is a single-ended push-pull amplifier including a capacitor 351, a resistor 352, a capacitor 353, a resistor 354, and transistors 355-358. Capacitor 351 has a first terminal for receiving the RFP_IN signal, and a second terminal. Resistor 352 has a first terminal for receiving a variable bias signal controlled by a signal labeled "TRIMP_BIAS", and a second terminal connected to the second terminal of capacitor 351. Capacitor 353 has a first terminal for receiving the RFN_IN signal, and a second terminal. Resistor 354 has a first terminal for receiving a variable bias signal controlled by a signal labeled "TRIMN_BIAS", and a second terminal connected to the second terminal of capacitor 353. Transistor 355 is a P-channel transistor having a source connected to $V_{DD}$, a gate for receiving a second P-bias signal, and a drain. Transistor 356 is a P-channel transistor having a source connected to the drain of transistor 355, a gate connected to the second terminals of capacitor 351 and resistor 352, and a drain connected to integrated circuit terminal for providing a signal labeled "PA_OUT". Transistor 357 is an N-channel transistor having a drain connected to the drain of transistor 356, a gate connected to the second terminals of capacitor 353 and resistor 354, and a drain. Transistor 358 is an N-channel transistor having a drain connected to the source of transistor 357, a gate for receiving a second N-channel bias signal, and a source connected to $V_{SS}$.

In operation, first amplifier 310 is a single-ended output amplifier with a push-pull output stage. During calibration, it receives a local oscillator input signal (LO_IN) that has a duty cycle close to 50% or a duty cycle that may already deviate from 50%. The output of first amplifier 310 will deviate from the ideal square wave, and thus introduce even order harmonics into the signal, based on mismatches in the signal chain preceding first amplifier 310 and arriving as the LO_IN signal, and in the amplifier circuit itself. Inverter 311 inverts the LO_IN signal and provides it to both pullup path 320 and pulldown path 330. The pullup strength of inverter 321 and the pulldown strength of inverter 323 control the rate of activation of transistor 325. Thus first amplifier 310 provides transistor 322 with a variable drive strength determined by a trim signal for P-channel transistors. For example, transistor 322 can be a composite transistor with several segments, and its pullup drive strength is controlled by a digital P-channel trim signal that switches in or out segments of the composite transistor. Likewise, transistor 324 can be a composite transistor, and its pulldown drive strength is controlled by a digital N-channel trim signal that switches in or out segments of the composite transistor. Controller 250 iteratively adjusts the P- and N-channel digital trim signals that form the COARSE calibration signal in order to make the output a more ideal square wave. As noted above, this calibration reduces both the second order harmonic as well as higher order even harmonics.

Second amplifier 350 is a single-ended push-pull amplifier. Thus in this embodiment, an interface circuit 340 includes a non-overlapping clock generator 342 to provide non-overlapping drive signals to the input of second amplifier 350 to prevent large shoot-through currents that would occur if both P-channel transistor 356 and N-channel transistor 357 were simultaneously conductive. The non-overlapping clocks are AC coupled onto the gates of transistors 356 and 357. Fine calibration is achieved by adjusting variable DC bias voltages on the gate of these transistors. Thus the first terminal of resistor 352 provides a variable bias voltage controlled by signal TRIMP_BIAS to the gate of transistor 356, and the first terminal of resistor 354 provides a variable bias voltage controlled by signal TRIMN_BIAS to the gate of transistor 357. Controller 250 refines these bias voltages to reduce the difference between the output of lowpass filter 240 and a second target level. For example, controller 250 can use digitally-determined proportions of the power supply voltage to provide the gate bias signals.

Figure 4:
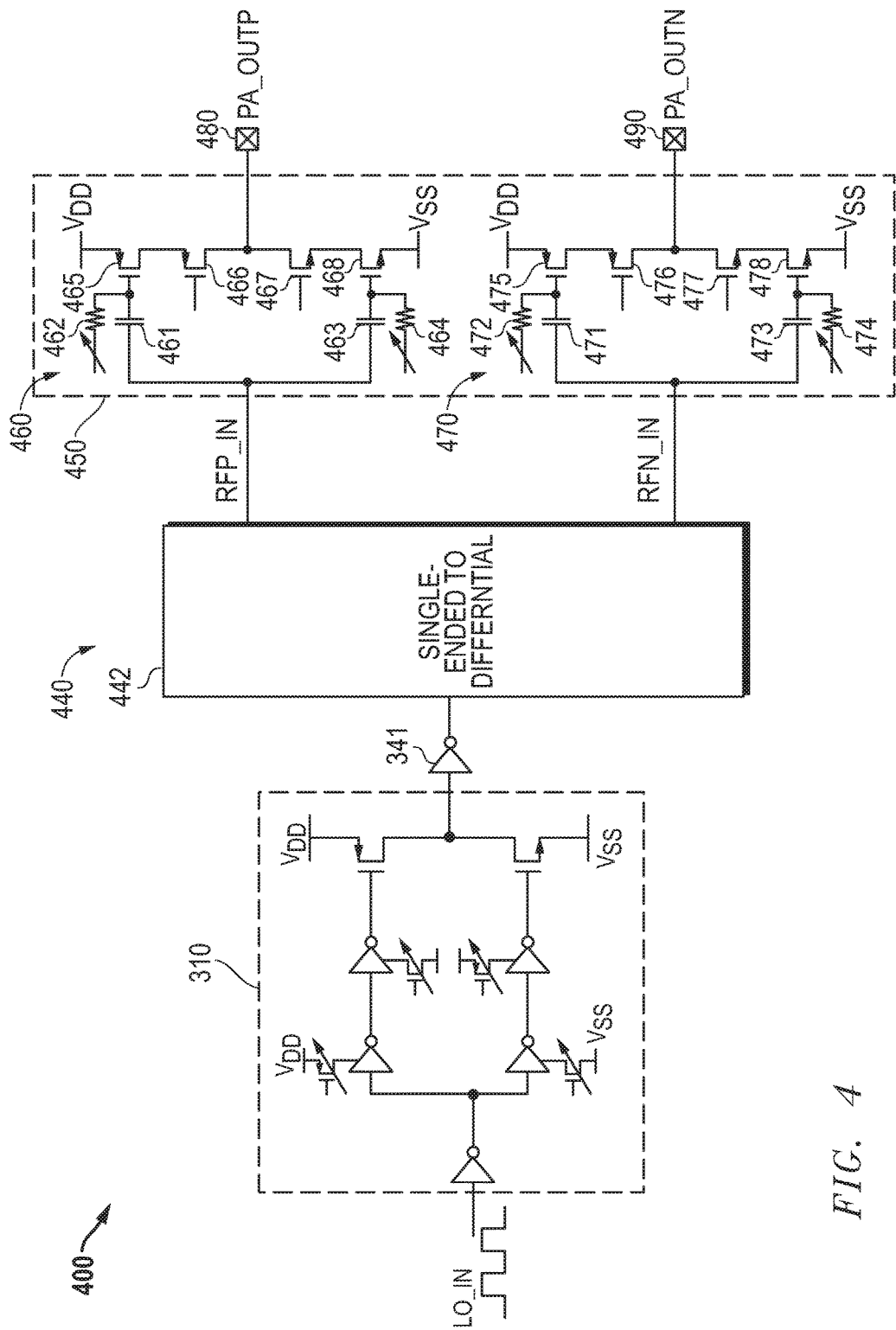
FIG. 4 illustrates in partial block diagram and partial schematic form an amplifier section of the power amplifier system of FIG. 2 according to a second embodiment.

FIG. 4 illustrates in partial block diagram and partial schematic form an amplifier section 400 of power amplifier system 200 of FIG. 2 according to a second embodiment. Amplifier section 400 includes first amplifier 310, an interface circuit 440, and a second amplifier 450 (corresponding to amplifier 234 in FIG. 2).

Interface circuit 440 includes inverter 341 and a single-ended to differential converter 442. Single-ended to differential converter 442 has an input connected to the output of inverter 341, a first output for providing RFP_IN, and a second output for providing RFN_IN.

Second amplifier 450 is a differential complementary amplifier stage including a positive signal driver portion 460 and a negative signal driver portion 470. Positive signal driver portion 460 includes a capacitor 461, a resistor 462, a capacitor 463, a resistor 464, P-channel transistors 465 and 466, and N-channel transistors 467 and 468. Capacitor 461 has a first terminal for receiving the RFP_IN signal, and a second terminal. Resistor 462 has a first terminal for receiving variable bias signal controlled by signal TRIMP_BIAS, and a second terminal connected to the second terminal of capacitor 461. Capacitor 463 has a first terminal for receiving the RFP_IN signal, and a second terminal. Resistor 464 has a first terminal for receiving variable bias signal controlled by signal TRIMN_BIAS, and a second terminal connected to the second terminal of capacitor 463. Transistor 465 is a P-channel transistor having a source connected to $V_{DD}$, a gate connected to the second terminals of capacitor 461 and resistor 462, and a drain. Transistor 466 is a P-channel transistor having a source connected to the drain of transistor 465, a gate for receiving a third P-bias signal, and a drain connected to integrated circuit terminal 480 for providing a signal labeled "PA_OUTP". Transistor 467 is an N-channel transistor having a drain connected to the drain of transistor 466, a gate for receiving a second N-channel bias signal, and a drain. Transistor 468 is an N-channel transistor having a drain connected to the source of transistor 467, a gate connected to the second terminals of capacitor 463 and resistor 464, and a source connected to $V_{SS}$.

Negative signal driver portion 470 includes a capacitor 471, a resistor 472, a capacitor 473, a resistor 474, P-channel transistors 475 and 476, and N-channel transistors 477 and 478. Capacitor 471 has a first terminal for receiving the RFN_IN signal, and a second terminal. Resistor 472 has a first terminal for receiving variable bias signal controlled by signal TRIMN_BIAS, and a second terminal connected to the second terminal of capacitor 471. Capacitor 473 has a first terminal for receiving the RFN_IN signal, and a second terminal. Resistor 474 has a first terminal for receiving variable bias signal controlled by signal TRIMN_BIAS, and a second terminal connected to the second terminal of capacitor 473. Transistor 475 is a P-channel transistor having a source connected to $V_{DD}$, a gate connected to the second terminals of capacitor 471 and resistor 472, and a drain. Transistor 476 is a P-channel transistor having a source connected to the drain of transistor 475, a gate for receiving a third P-bias signal, and a drain connected to integrated circuit terminal 490 for providing a signal labeled "PA_OUTN". Transistor 477 is an N-channel transistor having a drain connected to the drain of transistor 476, a gate for receiving a second N-channel bias signal, and a drain. Transistor 478 is an N-channel transistor having a drain connected to the source of transistor 477, a gate connected to the second terminals of capacitor 473 and resistor 474, and a source connected to $V_{SS}$.

In operation, amplifier section 400 uses the same preamplifier 310 as amplifier section 300 of FIG. 3. However it uses a differential complementary amplifier in place of second amplifier 350 of FIG. 2. Thus in this embodiment, an interface circuit 440 includes a single-ended to differential converter 442 to provide positive signal RFP_IN and negative signal RFN_IN to positive signal driver portion 460 and negative signal driver portion 470, respectively. Note that each portion of second amplifier 450 uses the same TRIMP_BIAS and TRIMN_BIAS signals to bias the gates of the transistors in the output stage as described with respect to FIG. 3.

Figure 5:
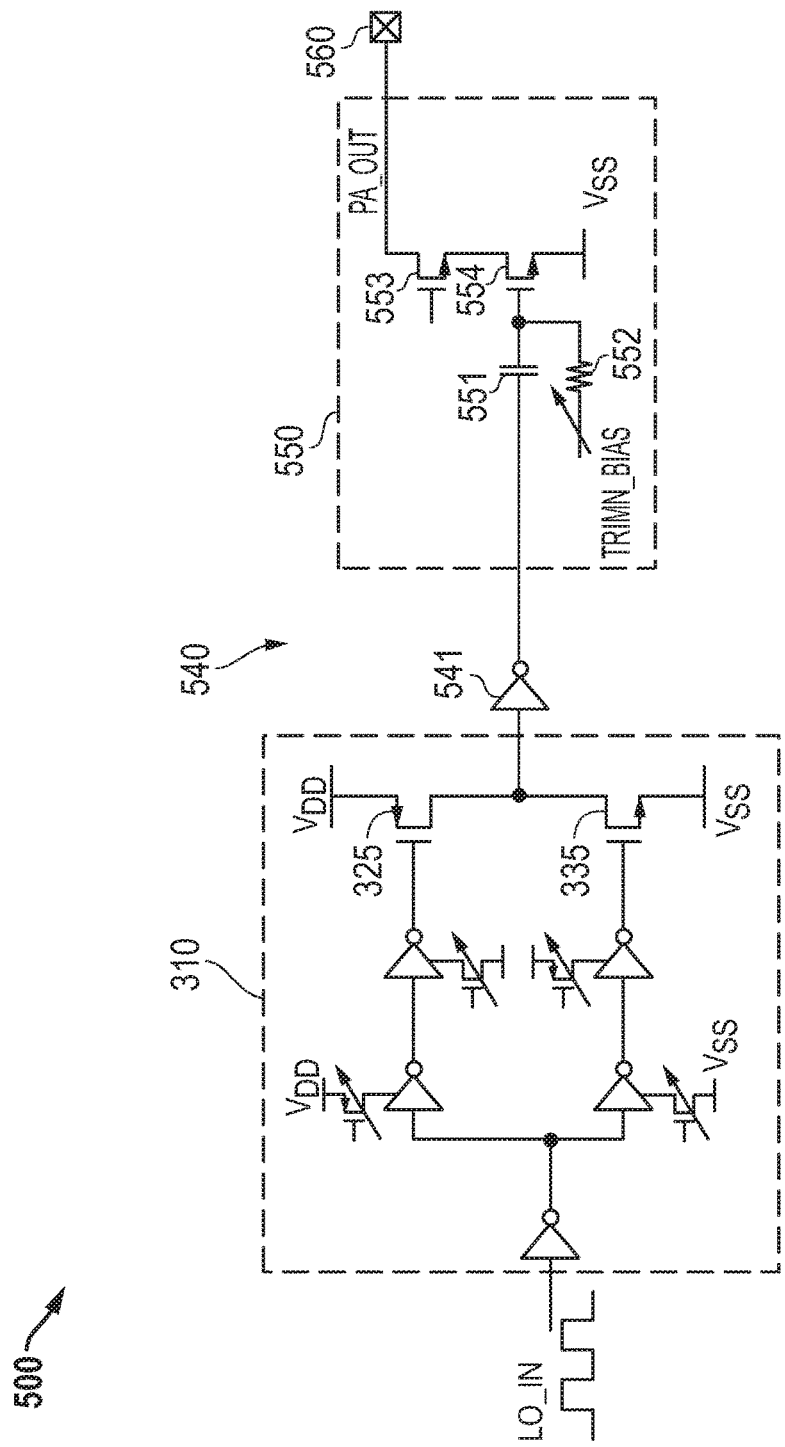
FIG. 5 illustrates in partial block diagram and partial schematic form an amplifier section of the power amplifier system of FIG. 2 according to a third embodiment.

FIG. 5 illustrates in partial block diagram and partial schematic form an amplifier section 500 of power amplifier system 200 of FIG. 2 according to a third embodiment. Amplifier section 500 includes first amplifier 310, an interface circuit 540, and a second amplifier 550 (corresponding to amplifier 234 in FIG. 2). Interface circuit 540 includes an inverter 541. Inverter 541 has an input connected to the drains of transistors 325 and 335, and an output. Second amplifier 550 is a single-ended open-drain amplifier stage including a capacitor 551, a resistor 552, and N-channel transistors 553 and 554, and an integrated circuit terminal 560. Capacitor 551 has a first terminal connected to the output of inverter 541, and a second terminal. Resistor 552 has a first terminal for receiving variable bias voltage controlled by signal TRIMN_BIAS, and a second terminal connected to the second terminal of capacitor 551. Transistor 553 is an N-channel transistor having a drain connected to an integrated circuit terminal 560 for providing signal PA_OUT, a gate for receiving a fourth N-channel bias signal, and a source. Transistor 554 is an N-channel transistor having a drain connected to the source of transistor 553, a gate connected to the second terminals of capacitor 551 and resistor 552, and a source connected to $V_{SS}$.

In operation, amplifier section 500 again uses the same preamplifier 310 as amplifier section 300 of FIG. 3. However it uses a single-ended open-drain output stage as second amplifier 550. Thus amplifier section 500 uses interface circuit 540 consisting of a single inverter 541 for use with second amplifier 550. Note that second amplifier 550 only requires the N-channel transistor 554 to be biased for fine calibration. Note also that during calibration lowpass filter 240 samples a signal at the drain of transistor 553, and thus measures the duty cycle when an external pullup termination resistor is connected to integrated circuit terminal 560.

Figure 6:
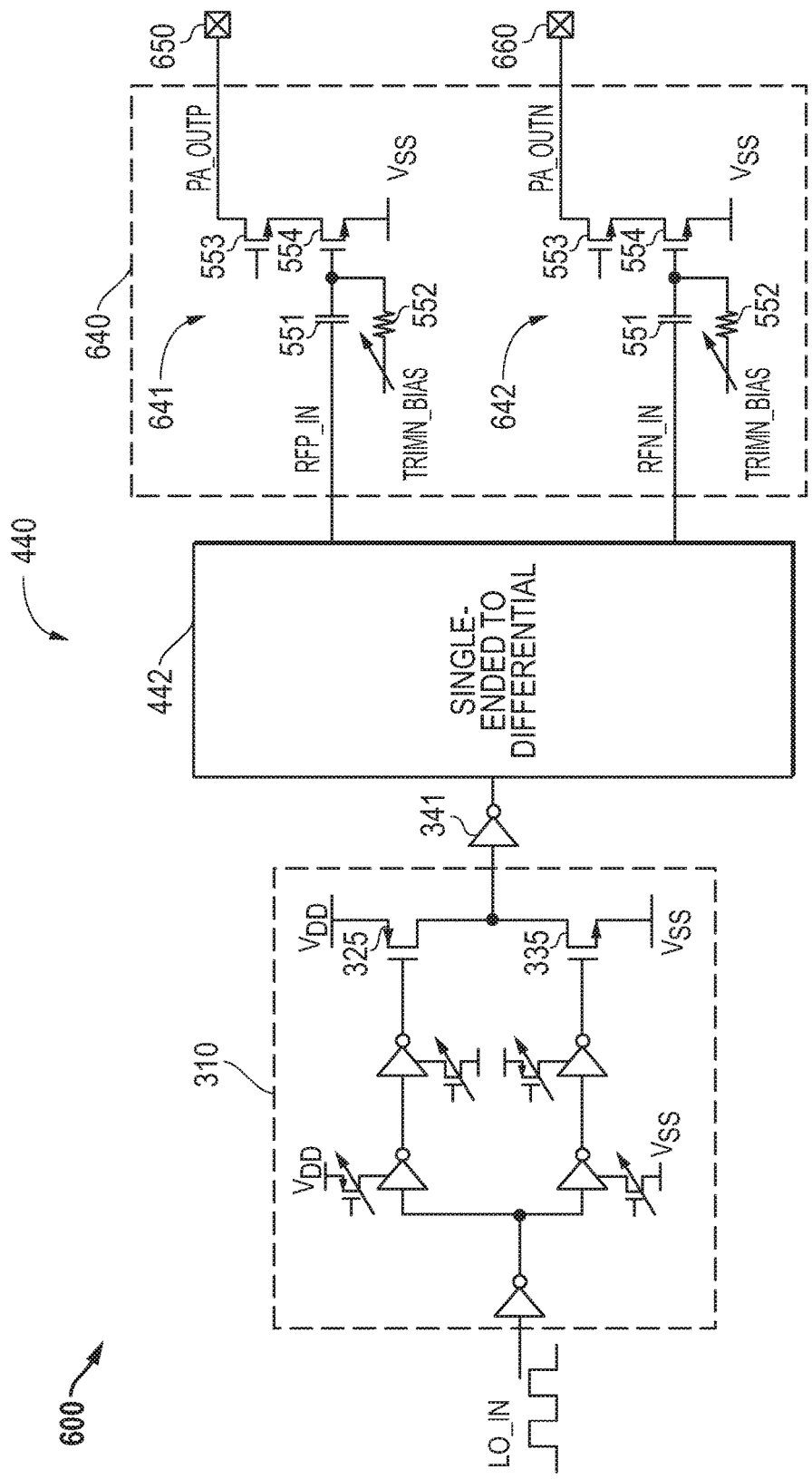
FIG. 6 illustrates in partial block diagram and partial schematic form an amplifier section of the power amplifier system of FIG. 2 according to a fourth embodiment.

FIG. 6 illustrates in partial block diagram and partial schematic form an amplifier section 600 of power amplifier system 200 of FIG. 2 according to a fourth embodiment. Amplifier section 600 includes first amplifier 310, interface circuit 440, and a second amplifier 640 (corresponding to amplifier 234 in FIG. 2). Second amplifier 640 includes a first single-ended open drain amplifier stage 641 and a second single-ended open-drain amplifier stage 642. First single-ended open drain amplifier stage 641 is constructed the same as second amplifier 550 of FIG. 5 except the first terminal of capacitor 551 receives signal RFP_IN from single-ended to differential converter 442, and the drain of transistor 553 provides the PA_OUTP signal to an integrated circuit terminal 650. Likewise second single-ended open-drain amplifier stage 642 is constructed the same as second amplifier 550 of FIG. 5 except the first terminal of capacitor 551 receives signal RFN_IN from single-ended to differential converter 440, and the drain of transistor 553 provides the PA_OUTN signal to an integrated circuit terminal 660.

In operation, amplifier section 600 again uses the same preamplifier 310 as amplifier section 300 of FIG. 3. However it uses a differential open drain output stage as second amplifier 640, and amplifier section 600 uses interface circuit 440 having single-ended to differential converter 442 to provide true and complement output drive signals RFP_IN and RFN_IN.

It should be apparent that the COARSE and FINE signals will vary between different embodiments and take on different forms. However in all these embodiments, the calibration procedure is effective in greatly reducing second- and other even-order harmonics, allowing the external hybrid matching network to be simplified or eliminated completely, reducing product cost.

Controller 250 operates power amplifier system 200 in a test mode or in a normal operation mode to transmit an RF signal using the COARSE and FINE signals determined during coarse and fine calibration.

Figure 7:
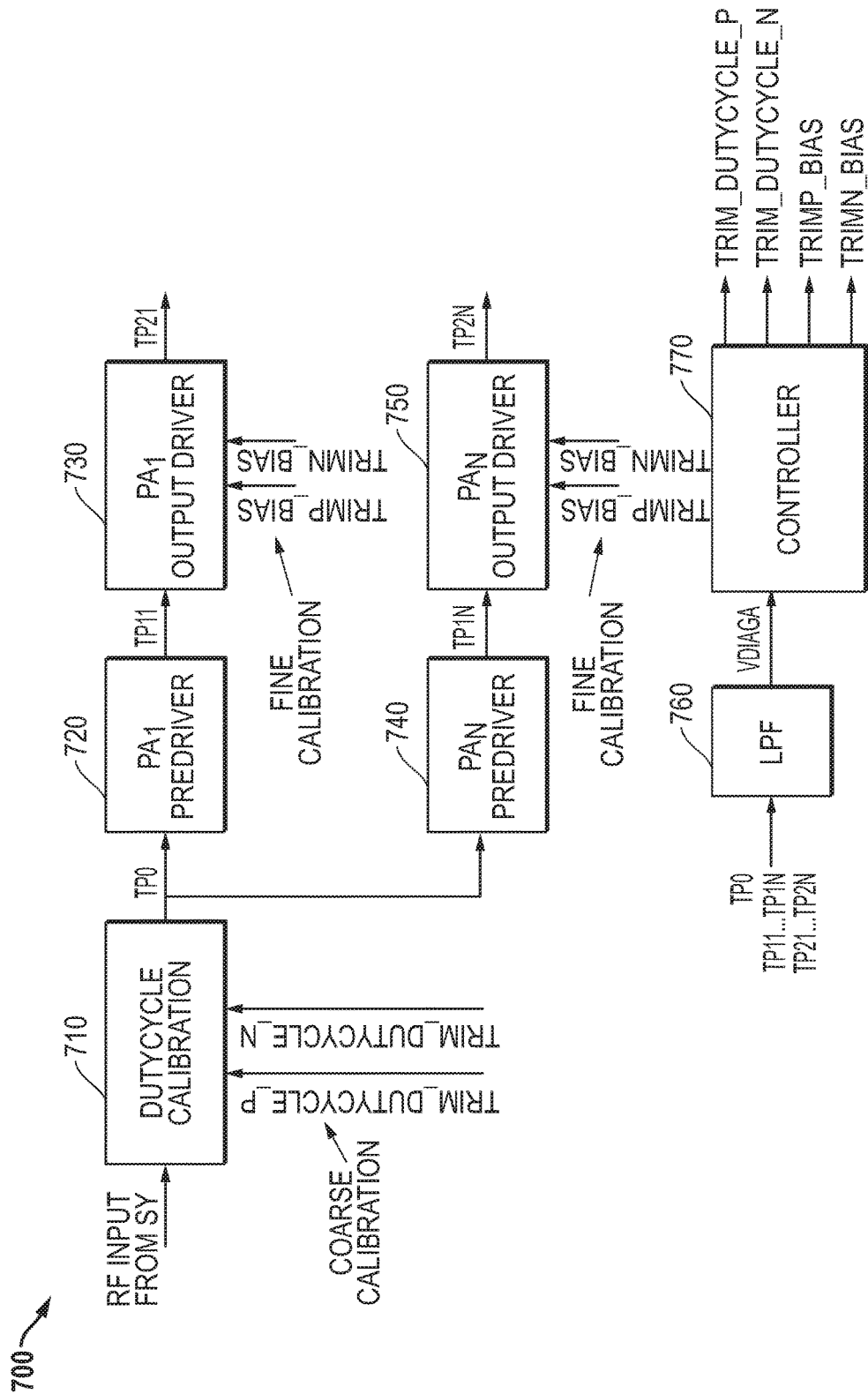
FIG. 7 illustrates in block diagram form a power amplifier system according to another embodiment.

FIG. 7 illustrates in block diagram form a power amplifier system 700 according to another embodiment. Power amplifier system 700 includes a duty cycle calibration block 710, a first power amplifier pre-driver 720, a first power amplifier output driver 730, an $n^{th}$ power amplifier pre-driver 740, an $n^{th}$ power amplifier output driver 750, a lowpass filter 760, and a controller 770. Duty cycle calibration block 710 has an input for receiving an RF input signal from a frequency synthesizer (not shown in FIG. 7), a first control input for receiving a signal labeled :TRIM_DUTYCYCLE_P", a second control input for receiving a signal labeled "TRIM_DUTYCYCLE_N", and an output connected to a node labeled "TP0". First power amplifier pre-driver 720 has an input connected to TP0, and an output connected to a node labeled "TP11". First power amplifier output driver 730 has an input connected to node TP11, an input for receiving the TRIMP_BIAS signal, an input for receiving the TRIMN_BIAS signal, and an output connected to a node labeled "TP21". $N^{th}$ power amplifier pre-driver 740 has an input connected to TP0, and an output connected to a node labeled "TP1N" for the $N^{th}$ amplifier output path. $N^{th}$ power amplifier output driver 750 has an input connected to a node labeled "TP1N" node for the $N^{th}$ amplifier output path, an input for receiving the TRIMP_BIAS signal, an input for receiving the TRIMN_BIAS signal, and an output connected to a node labeled TP2N node for the $n^{th}$ amplifier output path. Lowpass filter 760 has an input selectively connected to TP0, TP1$j$ and TP2$j$ of a selected ($j^{th}$) output path, and an output for providing a signal labeled "VDIAGA". Controller 770 has an input for receiving VDIAGA, and outputs for providing the TRIM_DUTYCYCLE_P, TRIM_DUTYCYCLE_N, TRIMP_BIAS, and TRIMN_BIAS signals.

Power amplifier system 700 shows another way in which duty cycle calibration can be carried out. Duty cycle calibration block 710 forms a first signal generation element that can be used to adjust the duty cycle. It receives the RF input from a frequency synthesizer, which will be a 50% duty cycle calibration signal or calibration signal that deviates somewhat from the ideal 50% duty cycle in calibration mode, and a modulated signal in normal operation mode. During coarse calibration, lowpass filter 760 measures the output of duty cycle calibration block 710, and controller 770 adjusts the TRIM_DUTYCYCLE_P and TRIM_DUTYCYCLE_N signals to reduce the difference between the output of lowpass filter 760 and the first target voltage level to below the first threshold. Lowpass filter 760 next samples the output of predrivers 720 and 740, and further adjusts the TRIM_DUTYCYCLE_P and TRIM_DUTYCYCLE_N signals to reduce the difference between the output of lowpass filter 760 and the first target voltage level to below the first threshold. During fine calibration, lowpass filter 760 samples the output of output drivers 730 and 750, and adjusts the TRIMP_BIAS and TRIMN_BIAS signals to reduce the difference between the output of lowpass filter 760 and the second target voltage level to below the second threshold.

Figure 8:
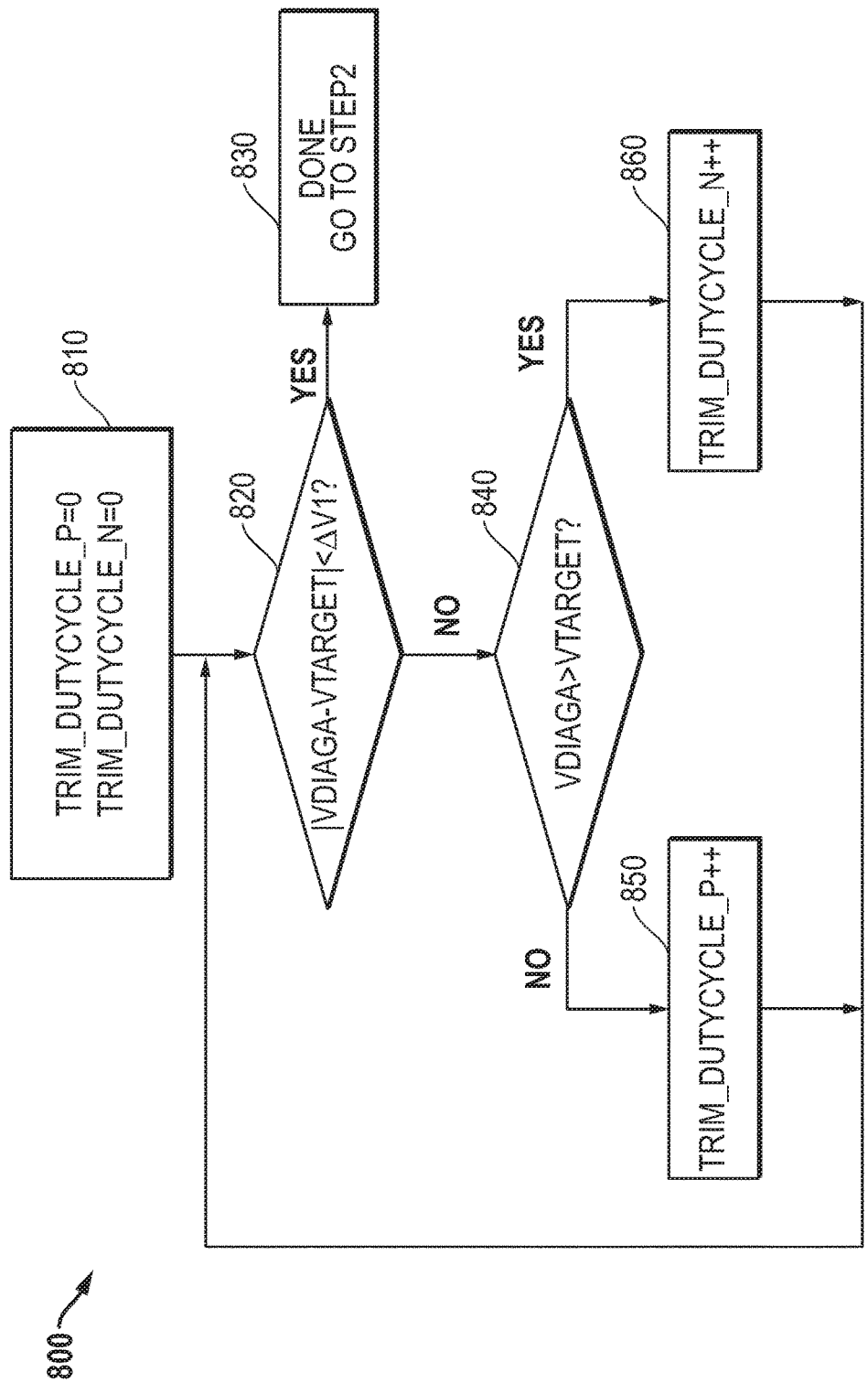
FIG. 8 illustrates a flow diagram of a coarse calibration of a power amplifier system according to first embodiment.

FIG. 8 illustrates a flow diagram 800 of a coarse calibration of a power amplifier system according to first embodiment. In an action box 810, controller 770 initializes TRIM_DUTYCYCLE_P and TRIM_DUTYCYCLE_N to 0. In decision box 820, controller 770 determines whether the duty cycle error is small enough. If the absolute value of the difference between VDIAGA and a target signal labeled "VTARGET" is not less than a first threshold labeled "ΔV1", then in decision box 840 controller 770 further determines whether VDIAGA is greater than VTARGET. If VDIAGA is not greater than VTARGET, then controller 770 increments TRIM_DUTYCYCLE_P, increasing the drive strength of the pullup portion of the pre-driver and therefore increasing the high-time and the duty cycle, and flow returns to decision box 820. If VDIAGA is greater than VTARGET, then controller 770 increments TRIM_DUTYCYCLE_N, increasing the drive strength of the pulldown and therefore decreasing the high-time and the duty cycle, and flow returns to decision box 820. If the absolute value of the difference between VDIAGA and a target signal VTARGET is less than ΔV1, then flow proceeds to action box 830. In action box 830, coarse calibration is done and controller 770 begins fine calibration.

Figure 9:
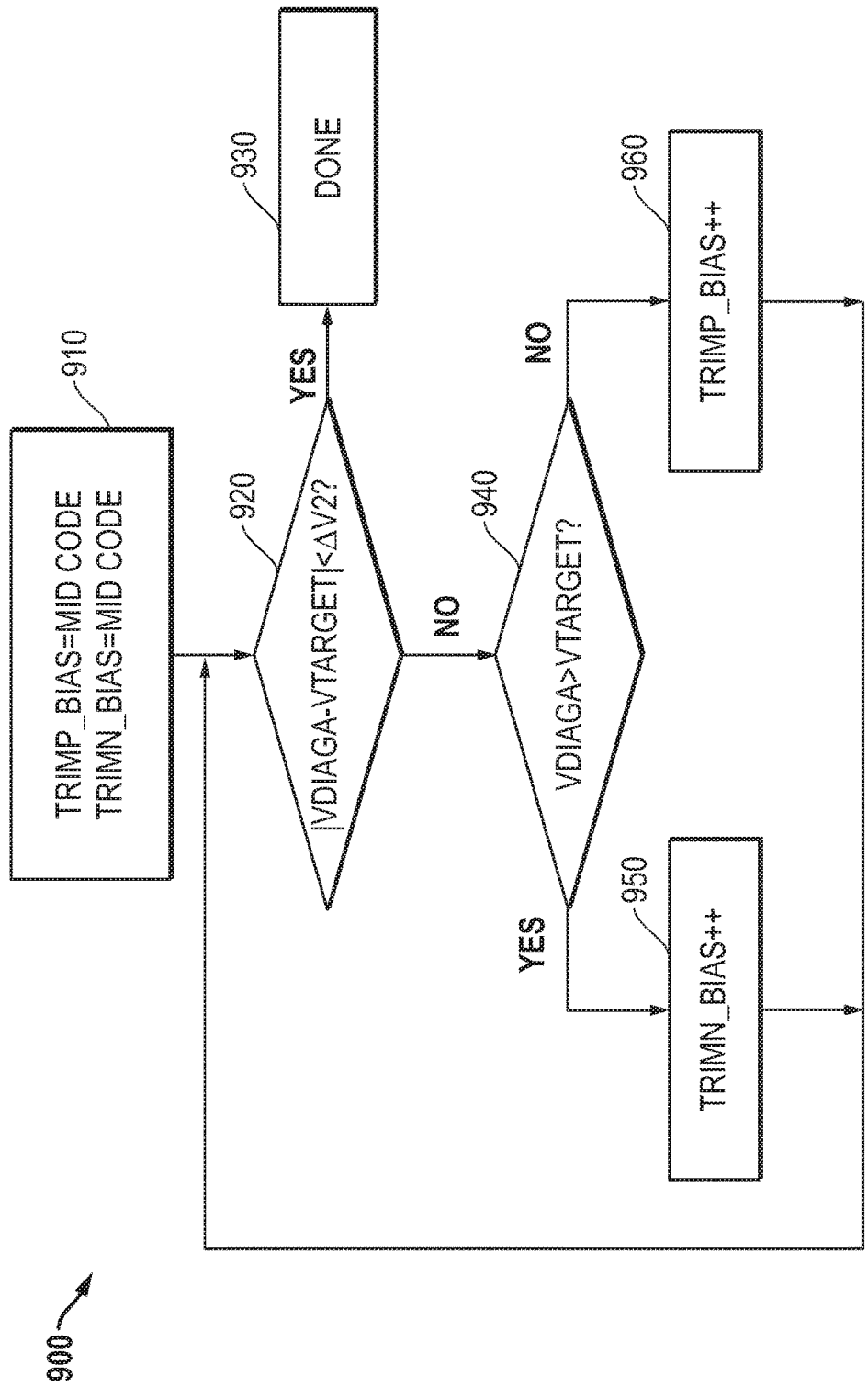
FIG. 9 illustrates a flow diagram of a fine calibration of the power amplifier system according to the first embodiment.

FIG. 9 illustrates a flow diagram 900 of a fine calibration of the power amplifier system according to the first embodiment. In action box 910, controller 770 initializes TRIMP_BIAS and TRIMN_BIAS to mid code values. In decision box 920, controller 770 determines whether the duty cycle error is small enough. If the absolute value of the difference between VDIAGA and VTARGET is not less than a second threshold labeled "ΔV2", then in decision box 940 controller 770 further determines whether VDIAGA is greater than VTARGET. If VDIAGA is greater than VTARGET, then controller 770 increments TRIMN_BIAS, increasing the bias point and conductivity of the pulldown transistor in the output driver and therefore decreasing the high-time and the duty cycle, and flow returns to decision box 920. If VDIAGA is not greater than VTARGET, then controller 770 increments TRIMP_BIAS, increasing the bias point and conductivity of the pullup transistor in the output driver and therefore increasing the high-time and the duty cycle, and flow returns to decision box 920. If the absolute value of the difference between VDIAGA and a target signal VTARGET is less than ΔV2, then flow proceeds to action box 930. In action box 930, fine calibration is done.

Figure 10:
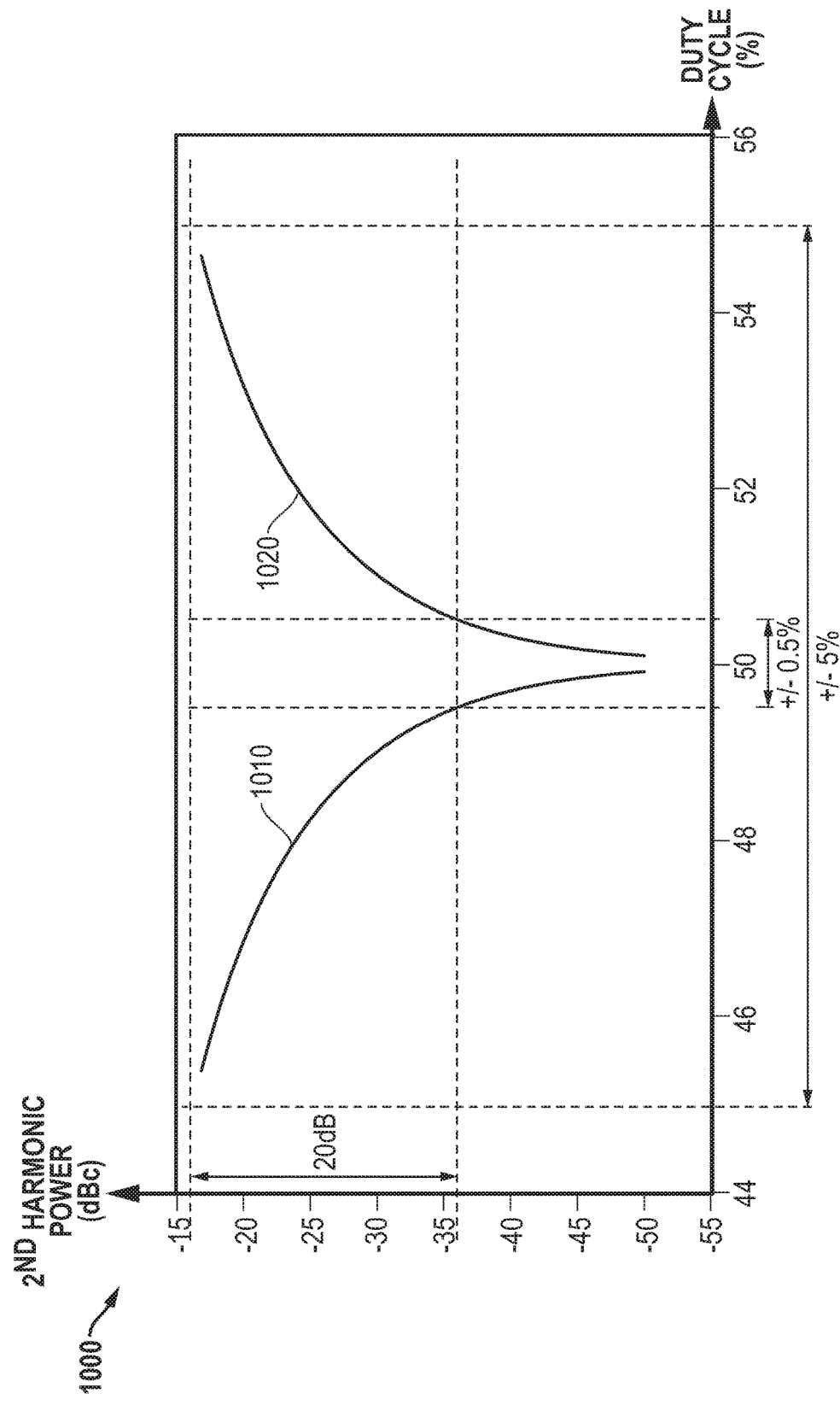
FIG. 10 illustrates a graph showing the reduction in the second harmonic after duty cycle calibration as disclosed above.

FIG. 10 illustrates a graph 1000 showing the reduction in the second harmonic after duty cycle calibration as disclosed above. In graph 1000, the horizontal axis represents duty cycle in percentage, and the vertical axis represents the power of the second harmonic, in decibels with respect to the fundamental or carrier (dBc) of a 50% duty cycle square wave input. A first representative curve 1010 and a second representative curve 1020 show the reduction in the second harmonic as duty cycle approaches 50%. If the output of the respective amplifier caused a +/−5% deviation in duty cycle due to mismatches, then the power of the second harmonic is about −16 dBc. If calibration reduces the deviation to +/−0.5%, then the power at the second harmonic is less than about −36 dBc, or a reduction of about 20 dBc.

The above-disclosed subject matter is to be considered illustrative, and not restrictive, and the appended claims are intended to cover all such modifications, enhancements, and other embodiments that fall within the true scope of the claims. For example, the calibration system can be used with a variety of amplifier forms, including single-ended push-pull, differential, differential complementary, open-drain, and differential open-drain. The amplifier calibration can also be in the form of drive strength adjustment of amplifiers or inverters inside the stage, DC bias points of drive transistors, etc. The number of amplifiers used can also vary between embodiments. In some embodiments, the second harmonic calibration allows a reduction in the order of the external harmonic filter matching network, but in other embodiments the external harmonic filter matching network can be eliminated entirely. While the examples of coarse and fine calibration disclosed above used digital adjustment of transistor drive strength and DC bias points, in other embodiments analog adjustment could also be used.

Thus, to the maximum extent allowed by law, the scope of the present invention is to be determined by the broadest permissible interpretation of the following claims and their equivalents, and shall not be restricted or limited by the foregoing detailed description.

What is claimed is:

1. A power amplifier system, comprising:
an amplification stage including a first amplifier having an input for receiving an input signal, a control input for receiving a first control signal, and an output, and a second amplifier having an input coupled to said output of said first amplifier, a control input for receiving a second control signal, and an output;
a low-pass filter having a first input coupled to said output of said first amplifier, a second input coupled to said output of said second amplifier, and an output; and
a controller having a first input coupled to said output of said low-pass filter, a first output coupled to said control input of said first amplifier, and a second output coupled to said control input of said second amplifier, wherein said controller varies said first control signal to reduce a difference between said output of said low-pass filter and a first target voltage level, and varies said second control signal to reduce a difference between said output of said low-pass filter and a second target voltage level.

2. The power amplifier system of claim 1, wherein said second target voltage level is different from said first target voltage level.

3. The power amplifier system of claim 1, wherein:
said controller varies said first control signal to reduce said difference between said output of said low-pass filter and said first target voltage level during a coarse calibration period, and subsequently varies said second control signal to reduce said difference between said output of said low-pass filter and said second target voltage level during a fine calibration period.

4. The power amplifier system of claim 1, wherein said first amplifier comprises:
a pullup path comprising:
a first set of inverters in which a pullup impedance of a first inverter and a pulldown impedance of a last inverter are controlled by a first trim signal;
a P-channel pullup transistor having a gate coupled to an output of said last inverter of said pullup path;
a pulldown path comprising:
a second set of inverters in which a pulldown impedance of a first inverter and a pullup impedance of a last inverter are controlled by a second trim signal; and
an N-channel pulldown transistor in series with said P-channel pullup transistor, wherein said first amplifier provides said output thereof at a common terminal between said P-channel pullup transistor and said N-channel pulldown transistor, said N-channel pulldown transistor having a gate coupled to an output of said last inverter of said pulldown path.

5. The power amplifier system of claim 1, further comprising:
a non-overlap clock generator having an input coupled to said output of said first amplifier, and an output for providing a pullup signal and a pulldown signal having respective active states that are non-overlapping with respect to each other.

6. The power amplifier system of claim 5, wherein:
said controller changes said first control signal in response to said output of said low-pass filter to make an average duty cycle of said pullup signal and said pulldown signal equal to approximately fifty percent.

7. The power amplifier system of claim 5, wherein said second amplifier is a single-ended complementary amplifier stage comprising:
a first capacitor having a first terminal for receiving said pullup signal, and a second terminal;
a first resistor having a first terminal for receiving a first bias voltage, and a second terminal coupled to said second terminal of said first capacitor;
a second capacitor having a first terminal for receiving said pulldown signal, and a second terminal;
a second resistor having a first terminal for receiving a second bias voltage, and a second terminal coupled to said second terminal of said second capacitor;
a pullup drive transistor having a first current electrode coupled to a first power supply voltage terminal, a control electrode coupled to said second terminals of said first capacitor and said first resistor, and a second current electrode for providing said output of said amplification stage; and
a pulldown drive transistor having a first current electrode coupled to said second current electrode of said pullup drive transistor, a control electrode coupled to said second terminals of said second capacitor and said second resistor, and a second current electrode coupled to a second power supply voltage terminal.

8. The power amplifier system of claim 7, wherein:
said first current electrode of said pullup drive transistor is coupled to said first power supply voltage terminal through a first bias transistor; and
said second current electrode of said pulldown drive transistor is coupled to said first power supply voltage terminal through a second bias transistor.

9. The power amplifier system of claim 1, further comprising:
a single-ended to differential converter having an input coupled to said output of said first amplifier, and an output for providing true and complementary drive signals.

10. The power amplifier system of claim 9, wherein said second amplifier comprises a differential complementary amplifier stage having first and second inputs for receiving said true and complementary drive signals, respectively, and first and second outputs for providing positive and negative output signals of a differential signal pair, respectively.

11. The power amplifier system of claim 9, wherein said second amplifier comprises a differential open-drain amplifier stage having first and second inputs for receiving said true and complementary drive signals, respectively, and first and second outputs for providing positive and negative output signals of a differential open-drain signal pair, respectively, wherein said controller varies said second control signal to reduce a difference between said output of said low-pass filter and said second target voltage level.

12. The power amplifier system of claim 1, wherein said second amplifier comprises a single-ended open-drain amplifier stage having an input coupled to said output of said first amplifier, and an output for providing an open-drain output signal to an integrated circuit terminal.

13. The power amplifier system of claim 12, wherein said single-ended open-drain amplifier stage comprises:
a capacitor having a first terminal coupled to said output of said first amplifier, and a second terminal;
a resistor having a first terminal for receiving said second control signal, and a second terminal coupled to said second terminal of said capacitor;
a first transistor having a drain coupled to said integrated circuit terminal, a gate for receiving a bias signal, and a source; and
a second transistor having a drain coupled to said source of said first transistor, a gate coupled to said second terminals of said capacitor and said resistor, and a source coupled to a power supply voltage terminal.

14. A power amplifier system, comprising:
an amplification stage having an input for receiving an input signal, and an output coupled to an integrated circuit terminal, said amplification stage comprises a plurality of amplifiers connected in series, each amplifier having an input, a control input for receiving a respective control signal, and an output;
a low-pass filter having a first input coupled to outputs of each of said plurality of amplifiers, and an output; and
a controller having a first input coupled to said output of said low-pass filter, and outputs coupled to respective control inputs of each of said plurality of amplifiers, wherein said controller varies said respective control signal of each of said plurality of amplifiers to reduce a difference between said output of said low-pass filter and respective target voltage levels when an input of said low-pass filter is coupled to a respective output of a corresponding amplifier.

15. The power amplifier system of claim 14, wherein:
a last amplifier of said an amplification stage comprises a single-ended push-pull amplifier.

16. The power amplifier system of claim 14, wherein:
a last amplifier of said an amplification stage comprises a differential complementary amplifier stage.

17. The power amplifier system of claim 14, wherein:
a last amplifier of said an amplification stage comprises a single-ended open-drain amplifier stage.

18. The power amplifier system of claim 14, wherein:
a last amplifier of said an amplification stage comprises a differential open-drain amplifier stage.

19. The power amplifier system of claim 14, wherein:
said plurality of amplifiers comprises a first amplifier having a control input for receiving a first control signal and an output, and a second amplifier having an input coupled to said output of said first amplifier and a control input for receiving a second control signal; and
said controller varies said first control signal to reduce said difference between said output of said low-pass filter and a first target voltage level during a coarse calibration period, and subsequently varies said second control signal to reduce said difference between said output of said low-pass filter and a second target voltage level during a fine calibration period.

20. A signal generation system, comprising:
a first signal generation element having an input for receiving an input signal, a control input for receiving a coarse control signal, and an output;

a second signal generation element having an input coupled to said output of said first signal generation element, a control input for receiving a fine control signal, and an output;

a low-pass filter having a first input coupled to said output of said first signal generation element, a second input coupled to said output of said second signal generation element, and an output; and a controller having an input coupled to said output of said low-pass filter, a first output for providing said coarse control signal, and a second element for providing said fine control signal, wherein said controller varies said coarse control signal to reduce a difference between said output of said low-pass filter and a first target voltage level, and subsequently varies said fine control signal to reduce a difference between said output of said low-pass filter and a second target voltage level.

21. The signal generation system of claim 20, wherein:
said second signal generation element is coupled to said first signal generation element through a non-overlapping clock generator; and
said second signal generation element comprises a single-ended push-pull amplifier.

22. The signal generation system of claim 20, wherein:
said second signal generation element is coupled to said first signal generation element through a single-ended to differential converter; and
said second signal generation element comprises a differential complementary amplifier stage.

23. The signal generation system of claim 20, wherein:
said second signal generation element comprises a single-ended open-drain amplifier stage.

24. The signal generation system of claim 20, wherein:
said second signal generation element is coupled to said first signal generation element through a single-ended to differential converter; and
said second signal generation element comprises a differential open-drain amplifier stage.

25. A method for calibrating an amplifier system having an amplification stage comprising a plurality of amplifiers connected in series including a first amplifier and a second amplifier having an input coupled to an output of the first amplifier, comprising:

low-pass filtering an output of the first amplifier to provide a low-pass filtered signal;

calibrating an even order harmonic of an output of the first amplifier, wherein said calibrating comprises changing pullup and pulldown strengths of the first amplifier until a difference between said low-pass filtered signal and a first target voltage level is less than a first threshold;

low-pass filtering an output of the second amplifier to provide said low-pass filtered signal;

calibrating an even order harmonic of the second amplifier, wherein said calibrating comprises changing pullup and pulldown strengths of the second amplifier to until a difference between said low-pass filtered signal and a second target voltage level is less than a second threshold; and amplifying an input signal using said first and second amplifiers to provide an output signal.

26. The method of claim 25 wherein:
said low-pass filtering said output of the first amplifier comprises providing a calibration signal to an input of the first amplifier.

27. The method of claim 26, wherein:
wherein said low-pass filtering said output of the first amplifier further comprises providing an even harmonic calibration signal to said input of the first amplifier.

28. The method of claim 25, wherein:
calibrating said even order harmonic of the output of the second amplifier comprises calibrating said even order harmonic of the output of the second amplifier after calibrating said even order harmonic of the output of the first amplifier.

* * * * *